United States Patent
Uchiyama (10) Patent No.: US 12,457,681 B2
(45) Date of Patent: Oct. 28, 2025

(54) SWITCHING POWER SUPPLY INCLUDING HEAT SINK

(71) Applicant: CANON KABUSHIKI KAISHA, Tokyo (JP)

(72) Inventor: Nobuyuki Uchiyama, Shizuoka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 447 days.

(21) Appl. No.: 18/192,785

(22) Filed: Mar. 30, 2023

(65) Prior Publication Data

US 2023/0337355 A1    Oct. 19, 2023

(30) Foreign Application Priority Data

Apr. 18, 2022 (JP) ................. 2022-068466

(51) Int. Cl.
| | |
|---|---|
| H05K 1/02 | (2006.01) |
| H02M 7/00 | (2006.01) |
| H02M 7/217 | (2006.01) |

(52) U.S. Cl.
CPC .......... *H05K 1/0216* (2013.01); *H02M 7/003* (2013.01); *H02M 7/217* (2013.01); *H05K 1/0203* (2013.01); *H05K 2201/066* (2013.01); *H05K 2201/1003* (2013.01); *H05K 2201/10166* (2013.01); *H05K 2201/10174* (2013.01)

(58) Field of Classification Search
CPC ................. H02M 3/003; H02M 7/003; H05K 2201/066; H05K 2201/1003
See application file for complete search history.

(56) References Cited

U.S. PATENT DOCUMENTS

| | | | | |
|---|---|---|---|---|
| 4,151,479 | A * | 4/1979 | Baba | ............ H03F 3/16 |
| | | | | 257/E23.184 |
| 6,583,682 | B1* | 6/2003 | Dubhashi | ............ H02M 5/45 |
| | | | | 363/39 |
| 8,880,911 | B2 | 11/2014 | Karino | |
| 9,106,148 | B2 | 8/2015 | Uchiyama | |
| 9,304,478 | B2 | 4/2016 | Hayasaki | |
| 9,787,205 | B2 | 10/2017 | Kobayashi | |
| 11,314,191 | B2 | 4/2022 | Uchiyama | |
| 2018/0042104 | A1* | 2/2018 | Nagaoka | ............ H02M 1/123 |
| 2018/0048229 | A1* | 2/2018 | Nagaoka | ............ H02M 7/217 |
| 2022/0352825 | A1 | 11/2022 | Uchiyama | |
| 2023/0135362 | A1 | 5/2023 | Uchiyama | |
| 2024/0235394 | A9* | 7/2024 | Ishikura | ............ H02M 1/327 |

FOREIGN PATENT DOCUMENTS

| | | |
|---|---|---|
| JP | 5-328710 A | 12/1993 |
| JP | 3515482 B2 | 4/2004 |
| JP | 2008-236988 A | 10/2008 |

* cited by examiner

*Primary Examiner* — Nathan Milakovich
(74) *Attorney, Agent, or Firm* — VENABLE LLP (57) ABSTRACT

A switching power supply apparatus includes a printed substrate, a transformer, a primary-side circuit, a secondary-side circuit, and some components. A semiconductor element is mounted on the printed substrate. A heat sink includes a connection portion and dissipates heat generated in the semiconductor element. The connection portion is connected to the printed substrate by soldering. A conductive pattern is formed on the printed substrate. An inductor is connected between the connection portion of the heat sink and a part of the pattern, and absorbs electrical noise induced to the heat sink.

18 Claims, 7 Drawing Sheets

SWITCHING POWER SUPPLY INCLUDING HEAT SINK

BACKGROUND OF THE INVENTION

Field of the Invention

The present disclosure relates to a switching power supply that includes a heat sink.

Description of the Related Art

A switching element used in a switching power supply has predetermined losses, and needs to release these losses as heat. In general, this heat is discharged into the air by a heat dissipation device. Here, high-frequency noise induced to the heat dissipation device becomes a problem. Japanese Patent Laid-Open No. 5-328710 suggests that high-frequency noise induced to a heat dissipation plate be released to the ground side by connecting a capacitor or a resistor with high resistance between an emitter of a transistor and the heat dissipation plate.

According to the invention of Japanese Patent Laid-Open No. 5-328710, the high-frequency noise is transferred from the heat dissipation plate to a circuit on the ground side. The high-frequency noise that has been transferred to the circuit on the ground side is further transferred to an AC (alternating-current) line and emitted into the air via the AC line, which acts as an antenna. In view of this, the present invention aims to reduce unnecessary emission of high-frequency noise into the air and transmission of the high-frequency noise to the circuit side.

SUMMARY OF THE INVENTION

The present disclosure provides a switching power supply apparatus comprising: a printed substrate; a transformer including a primary winding and a secondary winding; a primary-side circuit that is mounted on the printed substrate, that is connected to the primary winding of the transformer, and to which an alternating-current voltage is input; a secondary-side circuit that is mounted on the printed substrate, connected to the secondary winding of the transformer, and outputs a direct-current voltage; a semiconductor element mounted on the printed substrate; a heat sink that includes a connection portion and dissipates heat generated in the semiconductor element, the connection portion being connected to the printed substrate by soldering; a conductive pattern formed on the printed substrate; and an inductor that is connected between the connection portion of the heat sink and a part of the pattern, and absorbs electrical noise induced to the heat sink.

Further features of the present invention will become apparent from the following description of exemplary embodiments (with reference to the attached drawings).

BRIEF DESCRIPTION OF THE DRAWINGS

FIGS. 6A and 6B are diagrams for describing a noise absorption component that is applied for a secondary-side diode.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

Figure 1:
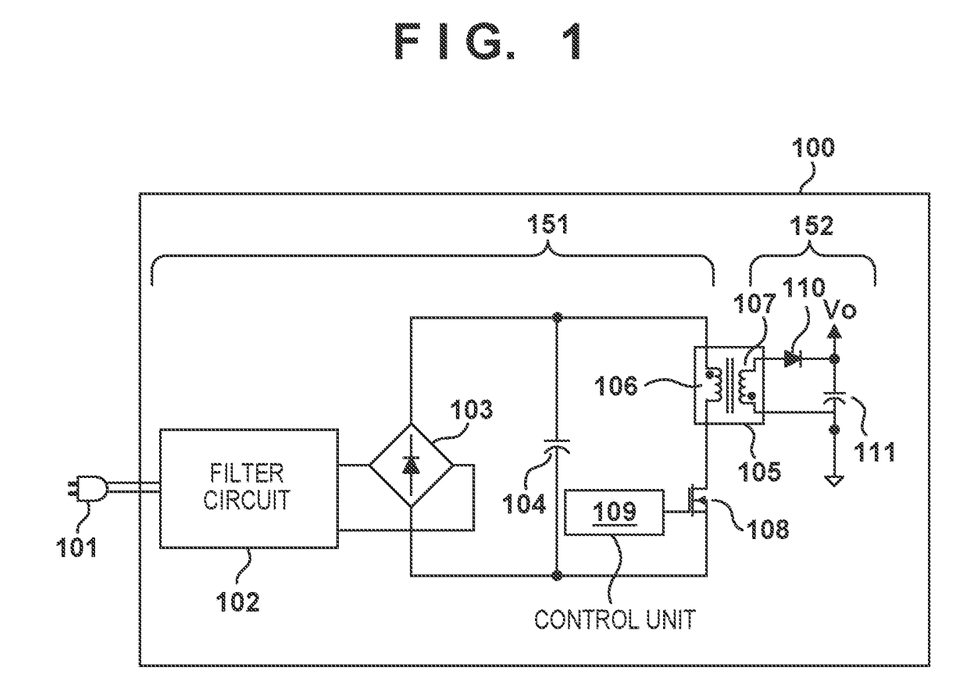
FIG. 1 is a circuit diagram of a switching power supply.

[Switching Power Supply]
FIG. 1 is a circuit diagram of a switching power supply 100. The switching power supply 100 includes an AC cord 101. An AC plug provided at a tip of the AC cord 101 is connected to a receptacle of an external power supply (e.g., a commercial alternating-current power supply), and receives an alternating-current voltage (AC voltage) supplied thereto. AC is an acronym for an alternating current. A filter circuit 102 is a line filter that reduces noise included in the AC voltage. A bridge diode 103 is a rectifier circuit (semiconductor rectifier element) that is connected to the filter circuit 102, applies full-wave rectification to the alternating-current voltage, and outputs a pulsating current. A primary-side smoothing capacitor 104 is a smoothing circuit or a smoothing element that generates a direct-current voltage (DC voltage) by smoothing the pulsating current. An insulating transformer 105 is a transformer element that provides insulation between a primary-side circuit 151 and a secondary-side circuit 152, and also transforms primary-side energy into secondary-side energy. One end of a primary winding 106 of the insulating transformer 105 is connected to a terminal of the smoothing capacitor 104 on the high-potential side. The other end of the primary winding 106 is connected, via an FET 108, to a terminal of the smoothing capacitor 104 on the low-potential side. FET is an acronym for a field-effect transistor. A secondary winding 107 is connected to the secondary-side circuit 152 composed of a diode 110 and a secondary-side smoothing capacitor 111. In the present embodiment, as the switching power supply 100 incorporates a flyback method, the position at which winding of the secondary winding 107 is started is opposite in direction to the position at which winding of the primary winding 106 is started (shown as a dot in the figure).

The FET 108 is a switching element that performs switching of the DC voltage applied to the primary winding 106. A control unit 109 is a control circuit, such as a CPU (central computational processing apparatus), for controlling a switching operation of the FET 108. When the control unit 109 applies a high-level signal to a gate terminal of the FET 108, electrical conduction is established between a drain terminal and a source terminal of the FET 108. As a result, a current flows from the primary-side smoothing capacitor 104 to the primary winding 106, and energy corresponding to the period of electrical conduction is stored in the insulating transformer 105. At this time, a voltage is generated in such a manner that, among the two ends of the secondary winding 107, the end at which winding is started becomes positive, whereas the end at which winding is completed becomes negative. In this case, an anode voltage of the secondary-side diode 110 becomes lower than a cathode voltage thereof, and no current flows from the secondary winding 107. On the other hand, when a low-level signal is applied to the gate terminal of the FET 108, an open state is established between the drain terminal and the source terminal of the FET 108. As a result, a voltage is generated in such a manner that the end at which winding of the secondary winding 107 is started becomes negative, whereas the end at which winding thereof is completed becomes positive. Consequently, the anode voltage of the secondary-side diode 110 becomes higher than the cathode voltage thereof, and a current flows from the secondary winding 107 via the secondary-side diode 110. In this way, a pulsed voltage is generated in the secondary winding 107 in coordination with the switching operation of the FET 108. The secondary-side diode 110 generates a pulsating current by rectifying this pulsed voltage. The secondary-side smoothing capacitor 111 generates a direct-current voltage by smoothing the pulsating current. This direct-current voltage is used as an output voltage Vo.

The semiconductors that are represented by the bridge diode 103, FET 108, and secondary-side diode 110, respectively, generate heat due to internal losses. In order to discharge this heat into the air, each semiconductor can be connected to a heat dissipation plate made of iron, aluminum, or the like. At a timing when the level of a pulse signal transmitted from the control unit 109 to the gate terminal of the FET 108 is switched from a high level to a low level, a high surge voltage is generated in the drain terminal of the FET 108.

[Heat Dissipation Device]

Figure 2A:
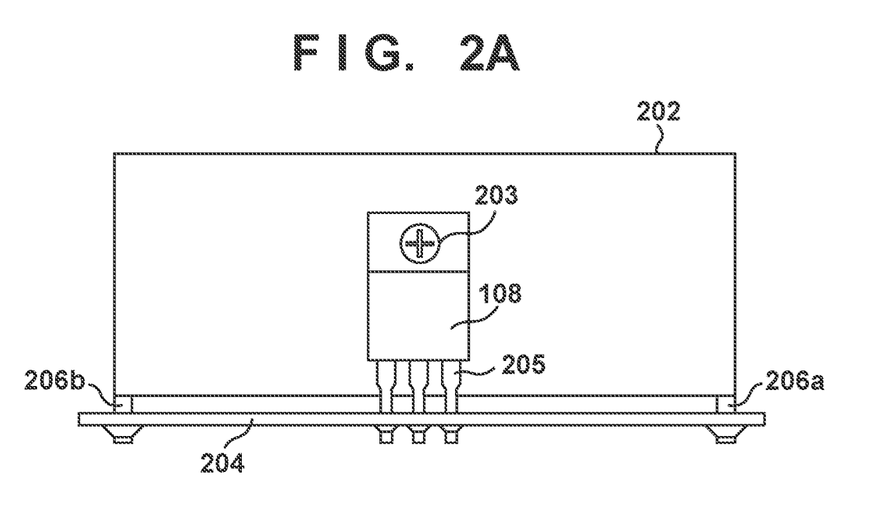
FIGS. 2A to 2C are diagrams for describing an FET and a heat dissipation plate.
Figure 2B:
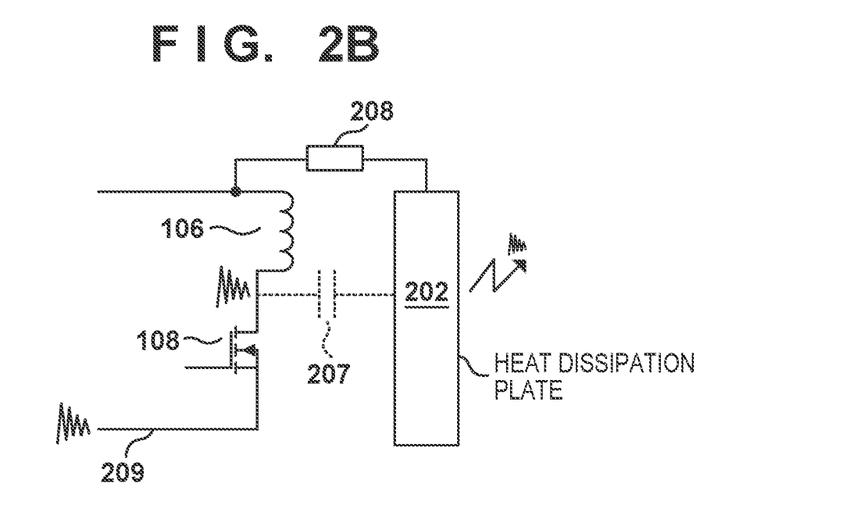
Figure 2C:
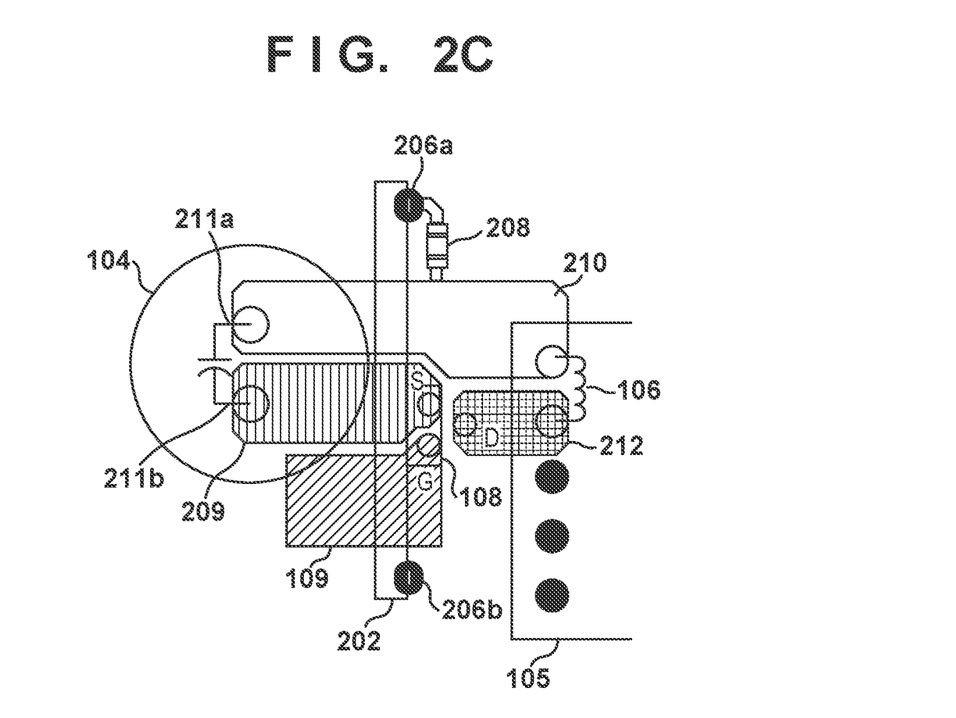

FIG. 2A to FIG. 2C show a state where the FET 108 and a heat dissipation plate 202 are attached to each other, as an example of connection between a semiconductor and a heat dissipation plate. FIG. 2A shows physical connection between the FET 108 and the heat dissipation plate 202. FIG. 2B shows electrical connection between the FET 108 and the heat dissipation plate 202. FIG. 2C shows a pattern layout.

In FIG. 2A, the FET 108 and the heat dissipation plate 202 are fastened to each other by a screw 203, and the heat dissipation plate 202 discharges heat generated by internal losses of the FET 108 into the air. The FET 108 is drawn as a component of a full-mold package type covered by plastic.

A printed substrate 204 is a substrate on which electronic components of the switching power supply 100 are mounted. The FET 108 includes three leads 205 that correspond to the source terminal S, drain terminal D, and gate terminal G. The three leads 205 are each soldered to the printed substrate 204. The heat dissipation plate 202 includes terminals 206a and 206b for fastening purpose. The terminals 206a and 206b are also soldered to the printed substrate 204.

In FIG. 2B, at a timing when the FET 108 is placed in the open state (OFF), a high surge voltage is generated in the drain terminal D of the FET 108. This is dependent on a relationship among leakage inductance of the primary winding 106, capacitance components that are mainly composed of the junction capacitance of the FET 108, and a drain current that was flowing immediately before the FET 108 was placed in the open state. The FET 108 is of a full-mold type covered by plastic, and the heat dissipation plate 202 is a metal. Therefore, the FET 108 and the heat dissipation plate 202 are isolated so as not to flow a DC electric current. However, a semiconductor chip that exists inside the FET 108 and the heat dissipation plate 202 are connected to each other at a high frequency via a small parasitic capacitance 207. Therefore, high-frequency noise generated in the drain terminal D of the FET 108 is transferred to the heat dissipation plate 202.

Here, assume that a noise absorption component 208 does not exist, and the heat dissipation plate 202 is not connected to the primary-side circuit 151. In this case, the high-frequency noise transferred to the heat dissipation plate 202 is emitted into the air at a certain timing. As a result, more noise is discharged from the switching power supply 100.

A configuration in which the terminals 206a and 206b of the heat dissipation plate 202 are directly connected to a source line of the FET 108 (a pattern 209), as well as a configuration in which the terminals 206a and 206b of the heat dissipation plate 202 are connected to the pattern 209 via a capacitor, is possible. With these configurations, the high-frequency noise transferred to the heat dissipation plate 202 can be transferred to the inside of the primary-side circuit 151 of the switching power supply 100 via the pattern 209, and ultimately emitted into the air via the AC cord 101, which acts as an antenna.

A configuration in which the terminals 206a and 206b of the heat dissipation plate 202 are connected to the pattern 209 of the FET 108 via a resistor, is also possible. With this configuration, in the case of a low-resistance value, the resistor makes significant losses, thereby increasing the size of the heat dissipation plate 202 and the like and leading to a cost increase. In the case of a high-resistance value, it is difficult to suppress the noise transferred to the heat dissipation plate 202, and large high-frequency noise is emitted into the air.

Therefore, it is necessary to devise a way to suppress emission of high-frequency noise from the heat dissipation plate 202 into the air, and also suppress transfer of high-frequency noise to the primary-side circuit 151. In the present embodiment, the noise absorption component 208 designed to reduce high-frequency noise is connected between the primary winding 106 and the heat dissipation plate 202. The noise absorption component 208 is, for example, an inductor such as a ferrite bead, a coil, and so forth.

It is sufficient that the noise absorption component 208 be connected between a pattern to which the terminals 206a and 206b of the heat dissipation plate 202 are connected and a low-impedance pattern. In FIG. 2C, the low-impedance pattern is a pattern 210 that connects the primary winding 106 and the smoothing capacitor 104. That is to say, the noise absorption component 208 is connected between the terminal 206a of the heat dissipation plate 202 and the pattern 210.

The high-frequency noise transferred from the drain terminal D of the FET 108 to the heat dissipation plate 202 via the parasitic capacitance 207 is promptly attenuated by the noise absorption component 208. This reduces the high-frequency noise emitted from the heat dissipation plate 202 into the air. Furthermore, the high-frequency noise transferred to the inside of the primary-side circuit 151 is also reduced.

FIG. 2C is to facilitate the understanding of a pattern layout of the smoothing capacitor 104, insulating transformer 105, primary winding 106, FET 108, heat dissipation plate 202, and noise absorption component 208, which are main components. A terminal 211a of the smoothing capacitor 104 on the high-potential side, as well as one terminal of the primary winding 106 in the insulating transformer 105, is connected to the pattern 210. The other terminal of the primary winding 106, as well as the drain terminal D of the FET 108, is connected to a pattern 212. The source terminal S of the FET 108 and a terminal 211b of the primary-side smoothing capacitor 104 on the low-potential side are connected to each other by the pattern 209. These patterns 209, 210, and 212 form a loop in which a high current flows. It is crucial to increase the thicknesses of the patterns 209, 210, and 212 in order to minimize this loop and to keep the impedance low.

On the other hand, the control unit 109, which is composed of a plurality of components, is connected to the gate terminal G of the FET 108. If the control unit 109 is laid out inside the loop, the control unit 109 malfunctions due to the electromagnetic effects attributed to the high current. For this reason, the control unit 109 is laid out outside the loop.

As such a pattern layout is necessary, the terminals 206a and 206b of the heat dissipation plate 202 are placed in areas away from the high-current loop and the control unit 109. A pattern that has the same potential as the pattern 209 on the low-potential side of the smoothing capacitor 104 exists also inside the control unit 109. Therefore, it is also possible to connect the noise absorption component 208 and this pattern inside the control unit 109. However, if a circuit other than the control unit 109 is connected to the pattern inside the control unit 109 on the low-potential side, the ground potential of the control unit 109 can fluctuate, which can cause the control unit 109 to malfunction. For this reason, connection of the noise absorption component 208 to the pattern inside the control unit 109 on the low-potential side is not implemented.

On the other hand, in a case where the noise absorption component 208 is connected to the terminal 211a of the smoothing capacitor 104 on the high-potential side, the terminal 206a of the heat dissipation plate 202 is naturally placed in the proximity of the pattern 210 on the high-potential side. As a result, an ideal pattern layout is realized.

Advantageous Effects of First Embodiment

Figure 3:
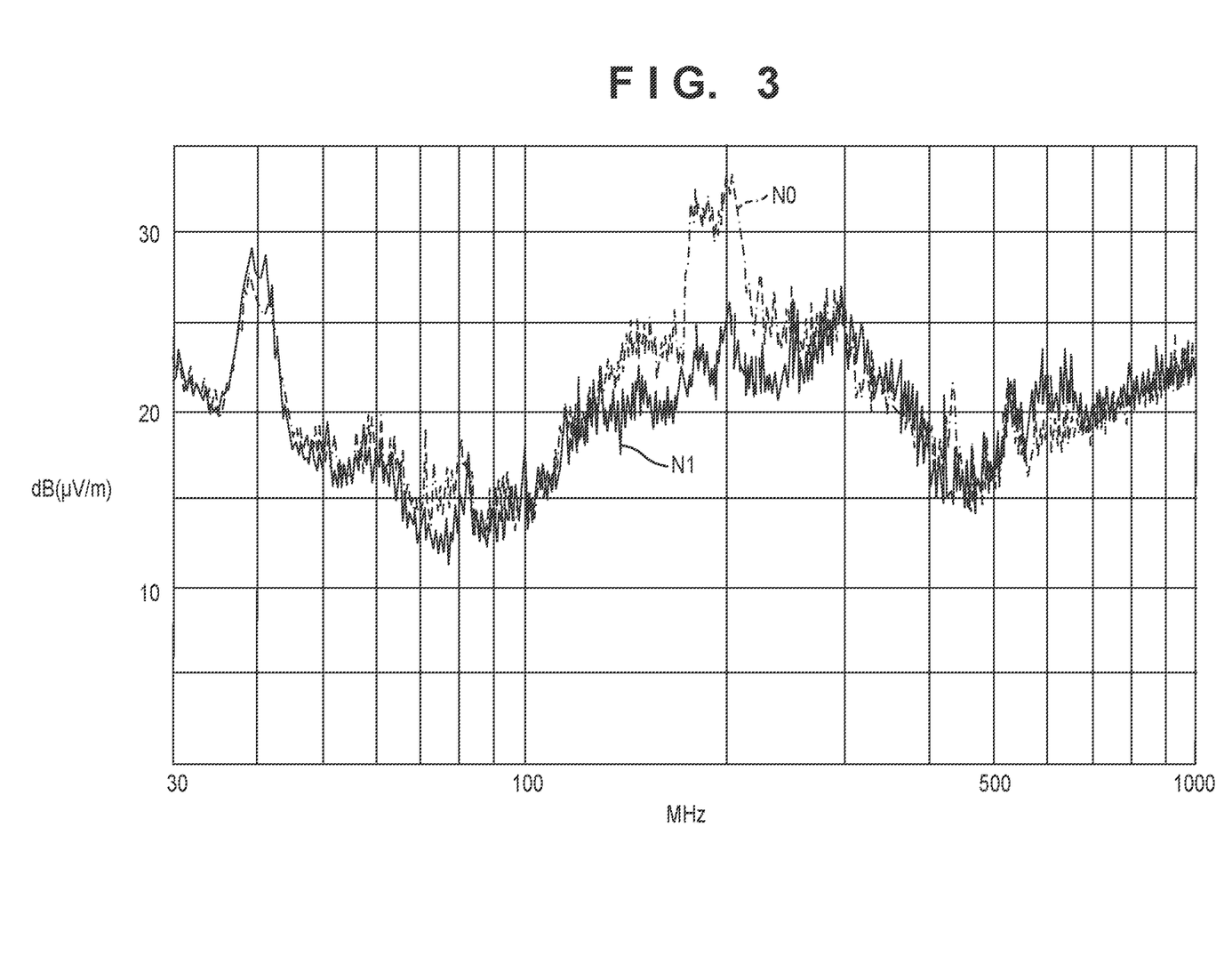
FIG. 3 is a diagram for describing the advantageous effects of a first embodiment.

FIG. 3 is a diagram for describing the advantageous effects of the first embodiment. A horizontal axis indicates frequencies. A vertical axis indicates noise levels. A line composed of alternating two dashes and one dot indicates a noise level N0 for a case where the noise absorption component 208 is not provided. A solid line indicates a noise level N1 for a case where the noise absorption component 208 is connected between the heat dissipation plate 202 and the terminal 211a of the smoothing capacitor 104 on the high-potential side. Comparing the two noise levels N0 and N1 with each other, it is apparent that the noise level N1 is lower than the noise level N0 in a wide range from 60 MHz to 300 MHz. Especially, in the first embodiment in which the noise absorption component 208 is provided, there is a significant decrease in noise in the vicinity of 200 MHz. The vicinity of 40 MHz is a frequency equivalent to approximately 2 m at a wavelength of λ/4. Therefore, it is considered that noise in the vicinity of 40 MHz is emitted from the AC cord 101.

Noise is reduced by placing the noise absorption component 208 between the heat dissipation plate 202 and the terminal 211a of the primary-side smoothing capacitor 104 on the high-potential side. In particular, noise that has been transferred from the FET 108 to the heat dissipation plate 202 via the parasitic capacitance 207 and then emitted from the heat dissipation plate 202 into the air, is reduced. Furthermore, noise that is emitted via the AC cord 101, which acts as an antenna, is also reduced.

While the FET 108 is assumed to be a full-mold package in the present embodiment, this is merely an example. Similar advantageous effects are achieved also in the case of a package where a portion of the FET 108 that is fastened by a screw is made of a metal.

Figure 4:
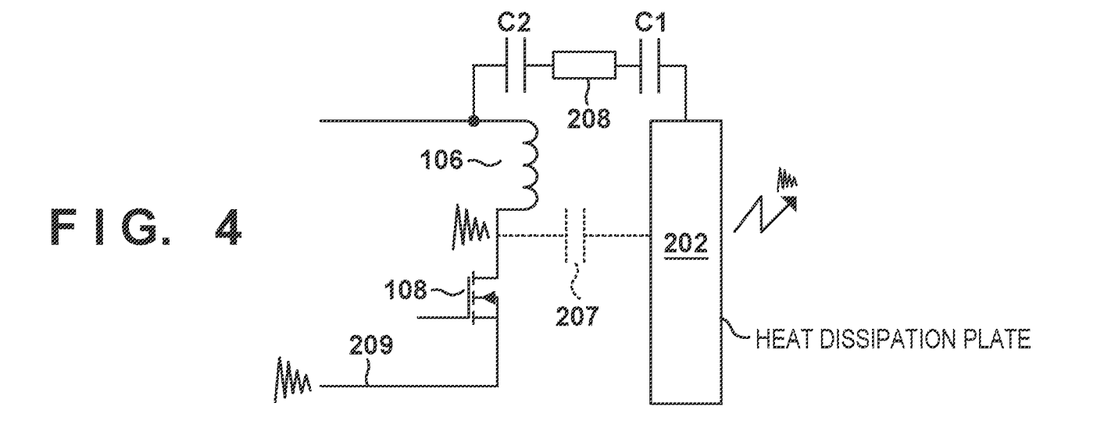
FIG. 4 is a diagram for describing a capacitance element that is connected in series to a noise absorption component.

Similar advantageous effects are achieved also when capacitors C1 and C2 are connected in series to the noise absorption component 208 in order to secure insulation or resistance to pressure, as shown in FIG. 4. That is to say, the capacitor C1 may be connected between the terminal 206a and the noise absorption component 208. Alternatively, the capacitor C2 may be connected between the noise absorption component 208 and the pattern 210. One of the two capacitors C1 and C2 may be incorporated, or both of them may be incorporated.

Second Embodiment

Figure 5A:
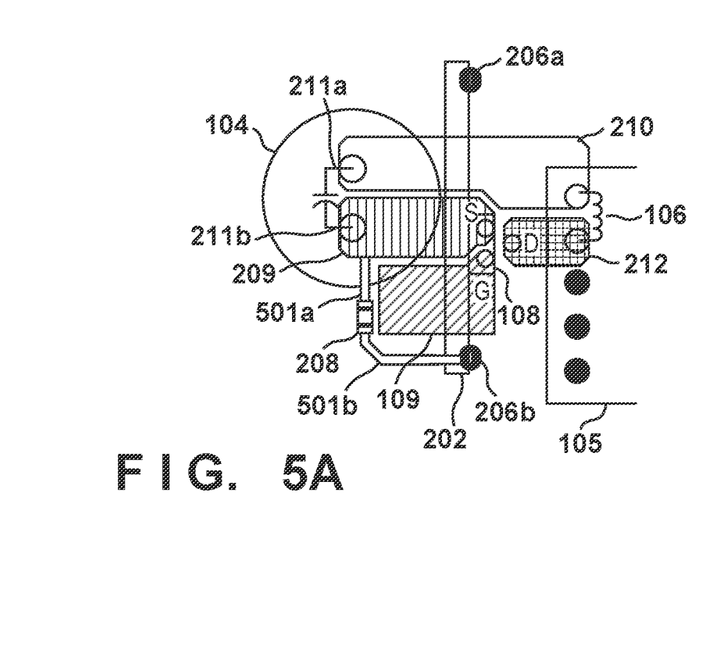
FIGS. 5A and 5B are diagrams for describing a layout of patterns connected to the noise absorption component.

In the first embodiment, the noise absorption component 208 is placed between the heat dissipation plate 202 and the terminal 211a of the primary-side smoothing capacitor 104 on the high-potential side. Consequently, noise discharged from the heat dissipation plate 202 and noise emitted from the AC cord 101 are reduced. As shown in FIG. 5A, in the second embodiment, the noise absorption component 208 is placed between the heat dissipation plate 202 and the terminal 211b of the primary-side smoothing capacitor 104 on the low-potential side.

The second embodiment differs from the first embodiment in that the noise absorption component 208 is connected to the terminal 211b of the primary-side smoothing capacitor 104 on the low-potential side. The distance from the terminal 206b of the heat dissipation plate 202 to the terminal 211b of the primary-side smoothing capacitor 104 on the low-potential side becomes relatively long. That is to say, a pattern 501a that connects the terminal 211b and the noise absorption component 208, as well as a pattern 501b that connects the noise absorption component 208 and the terminal 206b, can become long. However, the noise suppression effect of the second embodiment is similar to that of the first embodiment.

Although the patterns 501a and 501b connected to the noise absorption component 208 become long, this merely represents minute resistors in units of milliohms connected in series to the noise absorption component 208. Therefore, the high noise suppression effect is maintained.

Figure 5B:
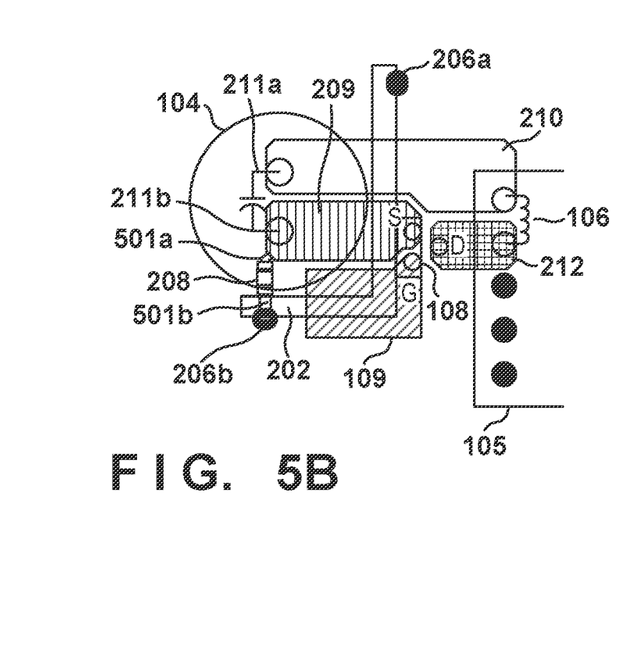

As shown in FIG. 5B, the shape of the heat dissipation plate 202 may be changed. When the heat dissipation plate 202 is L-shaped, the patterns 501a and 501b become short. As a result, the area for mounting on the printed substrate 204 can be reduced.

According to the second embodiment, the noise absorption component 208 is placed between the heat dissipation plate 202 and the terminal 211b of the primary-side smoothing capacitor 104 on the low-potential side. Consequently, noise emitted from the heat dissipation plate 202 and noise emitted from the AC cord 101 are reduced.

Third Embodiment

The first and second embodiments have been described in connection with a method of suppressing noise that is emitted from the heat dissipation plate 202 due to the switching operation of the FET 108. A third embodiment will be described in connection with a method of suppressing noise that is emitted from a heat dissipation plate of the secondary-side diode 110.

FIG. 6A is a diagram for describing electrical connection involving a heat dissipation plate 601 that diffuses heat of the secondary-side diode 110. As described above, the pulsed voltage generated in the secondary winding 107 is rectified by the secondary-side diode 110 and smoothed by the secondary-side smoothing capacitor 111, and a predetermined output voltage Vo is obtained. The secondary-side diode 110 has a property where a current temporarily flows in the opposite direction during a period from an ON state in which a voltage is applied in the forward direction and the current flows in the forward direction, to an OFF state in which the voltage is applied in the opposite direction and the current does not flow. High-frequency noise is generated due to this property. There are Schottky barrier diodes that do not have the opposite-direction property. However, diodes of this type have a similar property attributed to the junction capacitance. Therefore, high-frequency noise is generated also in diodes of this type.

A semiconductor chip that exists inside the diode 110 and the heat dissipation plate 601 are coupled to each other at a high frequency via a small parasitic capacitance 602. Consequently, the high-frequency noise is transferred from the diode 110 to the heat dissipation plate 601.

Terminals of the heat dissipation plate 601 that are intended for attachment are generally connected to a ground line 603. In this case, the high-frequency noise is transferred from the heat dissipation plate 601 to the ground line 603. Furthermore, the high-frequency noise is emitted via a voltage supply cable which is connected to the ground line 603 and which acts as an antenna. The same goes for a case where the terminals of the heat dissipation plate 601 that are intended for attachment are connected to an output terminal or a pattern for supplying the output voltage Vo to the outside.

As opposed to this, the noise absorption component 208 is connected between the heat dissipation plate 601 and a power supply line 604, which is a pattern to which the output voltage Vo is applied. Consequently, noise emitted from the heat dissipation plate 601 is reduced. Noise emitted from a cable connected to the ground line 603 is reduced as well.

As shown in FIG. 6B, the noise absorption component 208 may be connected to the ground line 603, which is a part of a pattern. In this case, too, noise emitted from the heat dissipation plate 601 and noise emitted from the cable connected to the ground line 603 are reduced.

The FET 108 and the secondary-side diode 110 may be surface-mounted components. In this case, printed patterns may be formed around the surface-mounted components in place of the heat dissipation plates 202 and 601. In this case, the noise absorption component 208 is connected to the printed patterns.

Figure 7A:
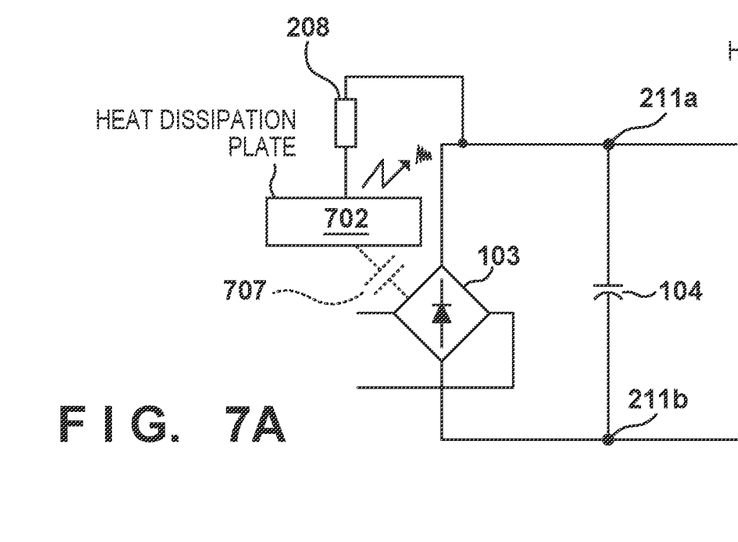
FIGS. 7A and 7B are diagrams for describing a noise absorption component that is applied for a primary-side diode.

FIG. 7A shows that the noise absorption component 208 is connected to a heat dissipation plate 702 that dissipates heat of the primary-side bridge diode 103. The bridge diode 103, too, is the source of noise because electrical conduction and blockage of a current are repeated therein. Parasitic capacitance 707 exists between the bridge diode 103 and the heat dissipation plate 702. Therefore, noise propagates from the bridge diode 103 to the heat dissipation plate 702 via the parasitic capacitance 707. Furthermore, noise is emitted from the heat dissipation plate 702. In view of this, the noise absorption component 208 is connected between the heat dissipation plate 702 and the terminal 211a on the high-potential side. Consequently, noise is reduced.

Figure 7B:
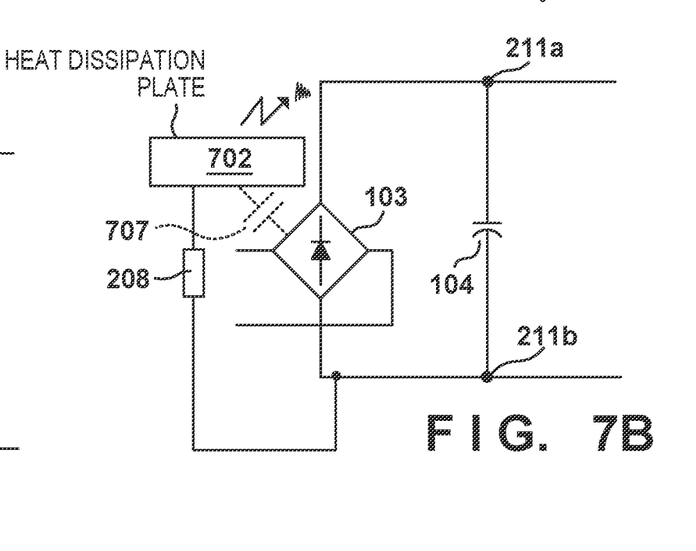

The noise absorption component 208 may be connected between the heat dissipation plate 702 and the terminal 211b on the low-potential side as shown in FIG. 7B. Noise may be reduced in this way.

Note that in FIG. 7A and FIG. 7B, too, patterns with large thicknesses are used in connection between the noise absorption component 208 and the terminals 211a and 211b, and connection between the noise absorption component 208 and terminals of the heat dissipation plate 702. Consequently, noise is further reduced.

Figure 8A:
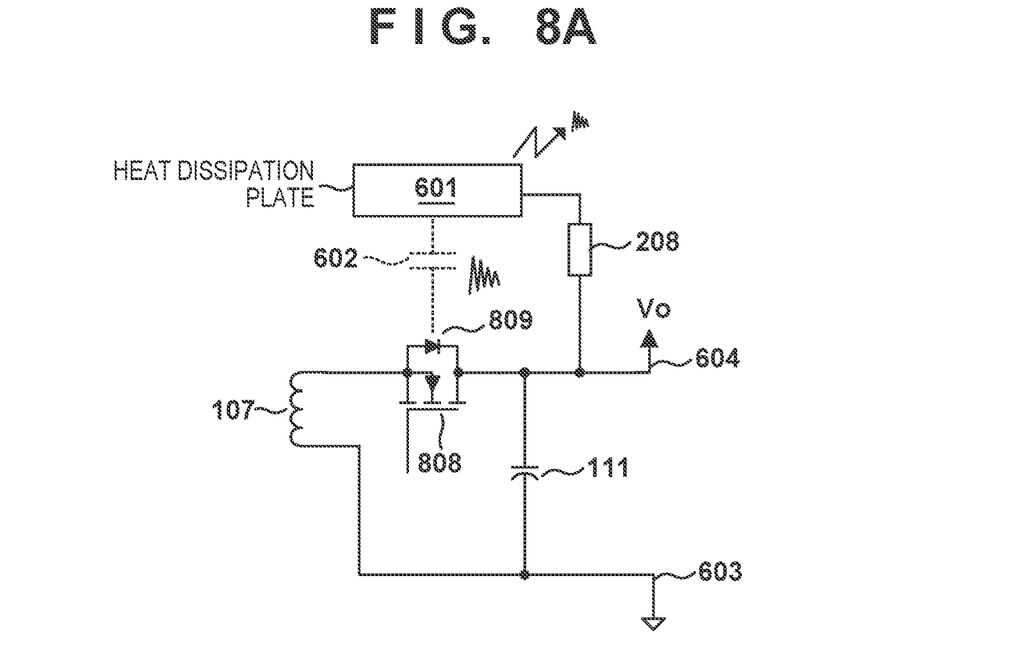
FIGS. 8A and 8B are diagrams for describing a noise absorption component that is applied for a secondary-side FET.
Figure 8B:
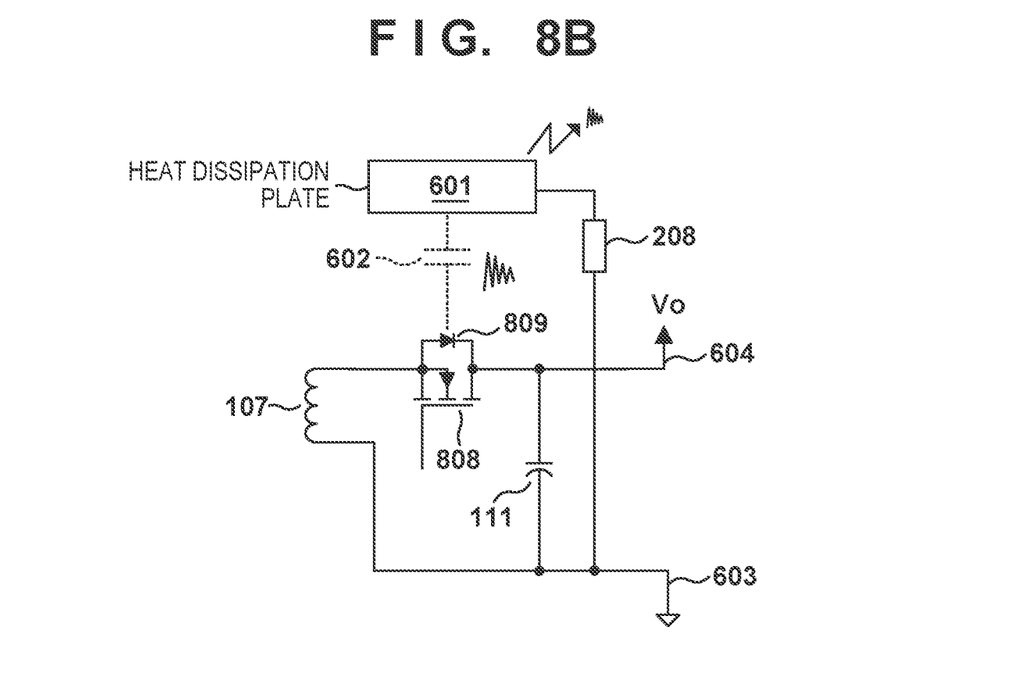

In FIG. 6A and FIG. 6B, the secondary-side diode 110 may be replaced with an FET. FIG. 8A and FIG. 8B show that the secondary-side diode 110 shown in FIG. 6A and FIG. 6B has been replaced with an FET 808. The FET 808 is an example of a rectifier element, such as a MOS-FET. The FET 808 may function as the rectifier element by turning ON/OFF in accordance with a control signal applied to a gate terminal.

The FET 808 includes a parasitic diode 809. Therefore, the parasitic diode 809 may function as the rectifier element. In this way, the noise absorption component 208 may be applied for the heat dissipation plate 601 that dissipates heat of the FET 808.

The FET 808 may be a surface-mounted component. In this case, a printed pattern may be formed around the surface-mounted component in place of the heat dissipation plate 601. In this case, the noise absorption component 208 is connected to the printed pattern.

Fourth Embodiment

Figure 9:
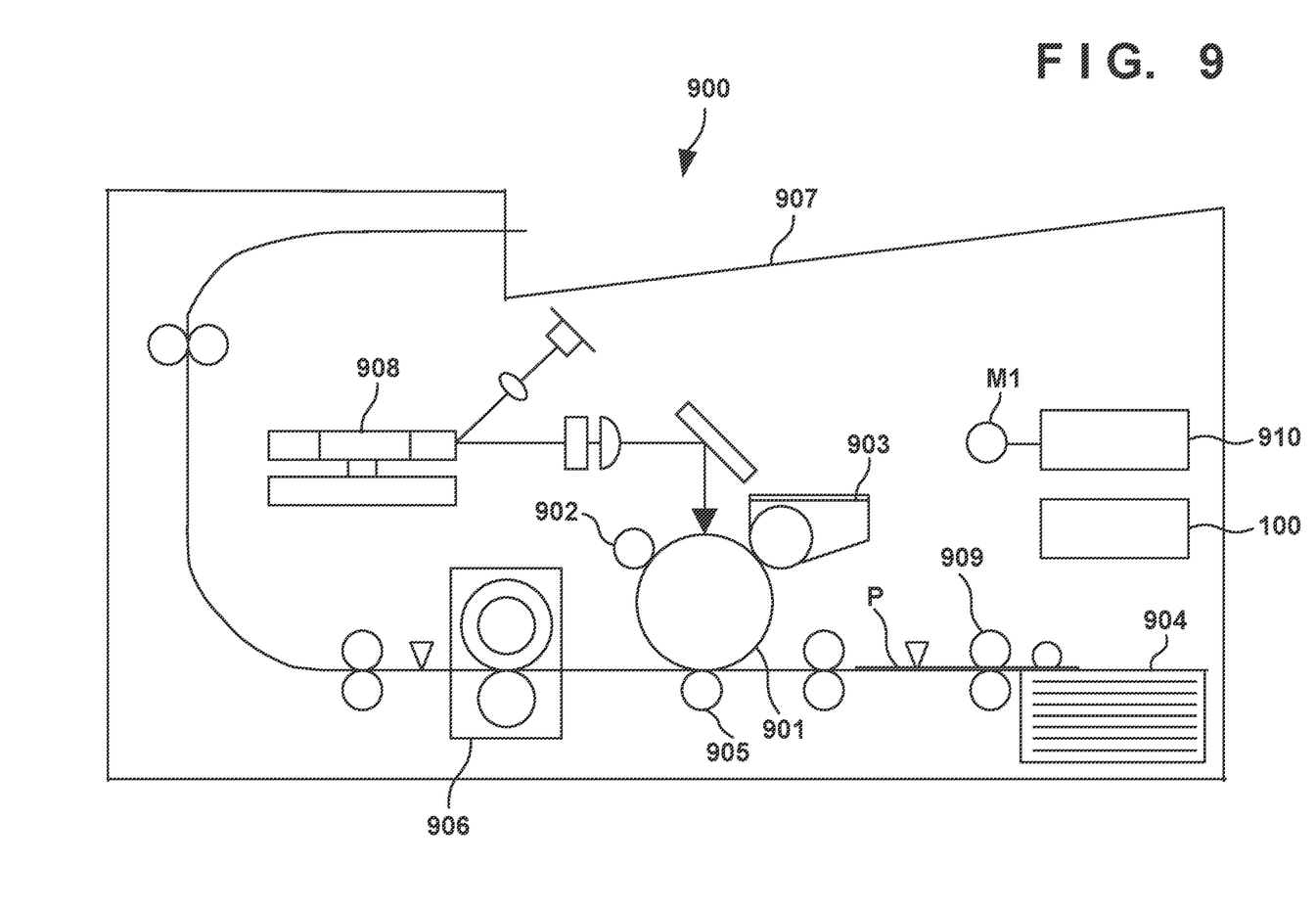
FIG. 9 is a diagram for describing an image forming apparatus provided with a switching power supply.

As shown in FIG. 9, a fourth embodiment relates to an image forming apparatus 900 that incorporates the switching power supply 100 that has been described in the first embodiment to the third embodiment. However, the switching power supply 100 may be incorporated as a power supply apparatus for an electronic device different from the image forming apparatus 900.

The image forming apparatus 900 is a laser beam printer of an electrophotographic method. A photosensitive drum 901 is an image carrier which rotates in one direction and on which an electrostatic latent image is formed. A charger 902 charges the photosensitive drum 901 uniformly. An exposure apparatus 908 forms the electrostatic latent image by irradiating a surface of the photosensitive drum 901 with a laser beam in accordance with an image signal. A development apparatus 903 includes a toner cartridge in which toner is stored, and a development sleeve that carries toner; it forms a toner image by developing the electrostatic latent image using the toner. Note that the photosensitive drum 901, the charger 902, the development apparatus 903, and a transfer roller 905 form an image forming unit.

A plurality of conveyance rollers 909 convey a sheet P stored in a storage 904. The transfer roller 905 transfers the toner image from the photosensitive drum 901 to the sheet P. A fixing device 906 applies heat and pressure to the sheet P and the toner image, thereby fixing the toner image on the sheet P. Thereafter, the sheet P is discharged to a sheet tray 907.

The switching power supply 100 supplies power to a motor M1 and a controller 910 that drive the photosensitive drum 901, the exposure apparatus 908, the conveyance rollers 909, and the like. The emission sources of noise emitted from the image forming apparatus 900 are possibly the controller 910, which deploys an image, and the switching power supply 100. Therefore, as the image forming apparatus 900 incorporates the switching power supply 100 that has been described in the first embodiment to the third embodiment, the image forming apparatus 900 with a small amount of noise emission is realized.

Technical Ideals Derived from Embodiments

[First Aspect]

As shown in FIG. 1, the primary-side circuit 151 is one example of a primary-side circuit which is mounted on the printed substrate 204 and to which an alternating-current voltage is input. The insulating transformer 105 is one example of a transformer connected to the primary-side circuit 151. The secondary-side circuit 152 is one example of a secondary-side circuit that is mounted on the printed substrate 204, is connected to the insulating transformer 105, and outputs a direct-current voltage (output voltage Vo). The FETs 108 and 808, the bridge diode 103, the diode 110, and the like are examples of a semiconductor element mounted on the printed substrate 204. The heat dissipation plates 202, 601, and 702 include a connection portion (e.g., the terminals 206a and 206b) that is connected to the printed substrate 204 by soldering, and function as a heat sink (heat dissipation unit) that dissipates heat generated in the semiconductor element. The patterns 210, 209, 501a, 501b, and the like are examples of a conductive pattern formed on the printed substrate 204. The noise absorption component 208 is one example of a noise absorption material which is connected between the connection portion of the heat sink and a part of the pattern that is a low-impedance circuit provided in the proximity of this connection portion, and which absorbs electrical noise. In this way, a pattern layout can be made simple while reducing unnecessary emission of high-frequency noise into the air and transfer of the high-frequency noise toward circuits.

[Second Aspect]

The bridge diode 103 is one example of a rectifier element that rectifies the alternating-current voltage and outputs a pulsating current. The smoothing capacitor 104 is one example of a smoothing element that includes a first terminal on the high-potential side (e.g., the terminal 211a) and a second terminal on the low-potential side (e.g., the terminal 211b), and generates a direct-current voltage by smoothing the pulsating current. The FET 108 is one example of a switching element that performs switching of the direct-current voltage. As shown in FIG. 5A and FIG. 5B, the low-impedance circuit may be a part of a pattern connected to the second terminal (e.g., the pattern 209).

[Third Aspect]

As shown in FIG. 2C, the low-impedance circuit may be a part of a pattern connected to the first terminal (e.g., the pattern 210).

[Fourth Aspect]

As shown in FIG. 6A and FIG. 6B, the semiconductor element may be a semiconductor element included in the secondary-side circuit (e.g., the diode 110). In this case, the low-impedance circuit may be a part of a pattern that supplies a ground potential in the secondary-side circuit (e.g., the ground line 603).

[Fifth Aspect]

As shown in FIG. 6A and FIG. 6B, the semiconductor element may be a semiconductor element included in the secondary-side circuit (e.g., the diode 110). In this case, the low-impedance circuit may be a part of a pattern that supplies an output voltage from the secondary-side circuit (e.g., the power supply line 604).

[Sixth and Seventh Aspects]

The semiconductor element may be a rectifier element (e.g., the diode 110 and the FET 808). The rectifier element may be a diode (e.g., the diode 110 and the parasitic diode 809 of the FET 808).

[Eighth Aspect]

The diode according to the seventh aspect (e.g., the diode 110) may be a surface-mounted component that is surface-mounted on the printed substrate 204.

[Ninth Aspect]

The heat sink according to the eighth aspect may be a printed pattern for heat dissipation formed around the diode, which is the surface-mounted component.

[Tenth Aspect]

As has been described in relation to FIG. 8A and FIG. 8B, the rectifier element may be a field-effect transistor (e.g., the FET 808 and the parasitic diode 809).

[Eleventh Aspect]

As has been described in relation to FIG. 8A and FIG. 8B, the field-effect transistor (e.g., the FET 808) may be a surface-mounted component that is surface-mounted on the printed substrate 204.

[Twelfth Aspect]

As has been described in relation to FIG. 8A and FIG. 8B, the heat sink (e.g., the heat dissipation plate 601) may be a printed pattern for heat dissipation formed around the field-effect transistor, which is the surface-mounted component.

[Thirteenth and Fourteenth Aspects]

As shown in FIG. 7A and FIG. 7B, the bridge diode 103 is one example of a semiconductor element that rectifies the alternating-current voltage and outputs a pulsating current. That is to say, the heat dissipation plate 702 may be applied for the bridge diode 103. In this case, the noise absorption component 208 is placed, which is connected between the connection portion of the heat dissipation plate 702 and a part of a pattern that is a low-impedance circuit provided in the proximity of this connection portion (e.g., the pattern 209), and which absorbs electrical noise. The smoothing capacitor 104 is one example of a smoothing element that includes a first terminal on the high-potential side (e.g., the terminal 211a) and a second terminal on the low-potential side (e.g., the terminal 211b), and generates a direct-current voltage by smoothing the pulsating current. In this case, the low-impedance circuit may be a part of a pattern connected to the second terminal (e.g., the pattern 209). Alternatively, the low-impedance circuit may be a part of a pattern connected to the first terminal (e.g., the pattern 210).

[Fifteenth Aspect]

As shown in FIG. 7A and FIG. 7B, the semiconductor element may be the bridge diode 103.

[Sixteenth and Seventeenth Aspects]

As has been described in relation to FIG. 4, the noise absorption material can include the noise absorption component 208 and a capacitance element (e.g., the capacitor C1) that is connected in series to the noise absorption component 208. The noise absorption component 208 may be an inductor designed to reduce electrical noise induced to the heat sink. The inductor may be a ferrite bead or a coil.

[Eighteenth Aspect]

As shown in FIG. 9, the image forming apparatus 900 including the switching power supply 100 is provided. The switching power supply 100 may be provided in another electronic device.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-068466, filed Apr. 18, 2022 which is hereby incorporated by reference herein in its entirety.

What is claimed is:

1. A switching power supply apparatus comprising:
a printed substrate;
a transformer including a primary winding and a secondary winding;
a primary-side circuit that is mounted on the printed substrate, that is connected to the primary winding of the transformer, and to which an alternating-current voltage is input;
a secondary-side circuit that is mounted on the printed substrate, connected to the secondary winding of the transformer, and outputs a direct-current voltage;
a semiconductor element mounted on the printed substrate;
a heat sink that includes a connection portion and dissipates heat generated in the semiconductor element, the connection portion being connected to the printed substrate by soldering;
a conductive pattern formed on the printed substrate; and
an inductor that is connected between the connection portion of the heat sink and a part of the pattern, and absorbs electrical noise induced to the heat sink.

2. The switching power supply apparatus according to claim 1, wherein
the primary-side circuit includes
a rectifier element that rectifies the alternating-current voltage and outputs a pulsating current, and
a smoothing element that includes a first terminal on a high-potential side and a second terminal on a low-potential side, and generates a direct-current voltage by smoothing the pulsating current,
the semiconductor element includes a switching element that performs switching of the direct-current voltage, and
the part of the pattern is connected to the second terminal.

3. The switching power supply apparatus according to claim 1, wherein
the primary-side circuit includes
a rectifier element that rectifies the alternating-current voltage and outputs a pulsating current, and
a smoothing element that includes a first terminal on a high-potential side and a second terminal on a low-potential side, and generates a direct-current voltage by smoothing the pulsating current,
the semiconductor element includes a switching element that performs switching of the direct-current voltage, and
the part of the pattern is connected to the first terminal.

4. The switching power supply apparatus according to claim 1, wherein
the semiconductor element is a semiconductor element included in the secondary-side circuit, and
the part of the pattern supplies a ground potential in the secondary-side circuit.

5. The switching power supply apparatus according to claim 4, wherein
the semiconductor element is a rectifier element.

6. The switching power supply apparatus according to claim 5, wherein
the rectifier element is a diode.

7. The switching power supply apparatus according to claim 6, wherein
the diode is a surface-mounted component that is surface-mounted on the printed substrate.

8. The switching power supply apparatus according to claim 7, wherein
the heat sink is a printed pattern for heat dissipation formed around the diode, which is the surface-mounted component.

9. The switching power supply apparatus according to claim 5, wherein
the rectifier element is a field-effect transistor.

10. The switching power supply apparatus according to claim 9, wherein
the field-effect transistor is a surface-mounted component that is surface-mounted on the printed substrate.

11. The switching power supply apparatus according to claim 10, wherein
the heat sink is a printed pattern for heat dissipation formed around the field-effect transistor, which is the surface-mounted component.

12. The switching power supply apparatus according to claim 1, wherein
the semiconductor element is a semiconductor element included in the secondary-side circuit, and the part of the pattern supplies an output voltage from the secondary-side circuit.

13. The switching power supply apparatus according to claim 1, wherein the primary-side circuit includes the semiconductor element that rectifies the alternating-current voltage and outputs a pulsating current, and a smoothing element that includes a first terminal on a high-potential side and a second terminal on a low-potential side, and generates a direct-current voltage by smoothing the pulsating current, and the part of the pattern is connected to the second terminal.

14. The switching power supply apparatus according to claim 13, wherein the semiconductor element is a bridge diode.

15. The switching power supply apparatus according to claim 1, wherein the primary-side circuit includes the semiconductor element that rectifies the alternating-current voltage and outputs a pulsating current, and a smoothing element that includes a first terminal on a high-potential side and a second terminal on a low-potential side, and generates a direct-current voltage by smoothing the pulsating current, and the part of the pattern is connected to the first terminal.

16. The switching power supply apparatus according to claim 1, further comprising:

a capacitance element connected in series to the inductor.

17. The switching power supply apparatus according to claim 1, wherein the inductor is a ferrite bead or a coil.

18. An image forming apparatus comprising:

an image forming unit configured to form an image on a sheet; and a switching power supply configured to supply electric power to the image forming unit, wherein the switching power supply comprising:

a printed substrate;

a transformer including a primary winding and a secondary winding;

a primary-side circuit that is mounted on the printed substrate, that is connected to the primary winding of the transformer, and to which an alternating-current voltage is input;

a secondary-side circuit that is mounted on the printed substrate, connected to the secondary winding of the transformer, and outputs a direct-current voltage;

a semiconductor element mounted on the printed substrate;

a heat sink that includes a connection portion and dissipates heat generated in the semiconductor element, the connection portion being connected to the printed substrate by soldering;

a conductive pattern formed on the printed substrate; and an inductor that is connected between the connection portion of the heat sink and a part of the pattern, and absorbs electrical noise induced to the heat sink.

* * * * *